United States Patent [19]
Takagi et al.

[11] Patent Number: 5,438,193
[45] Date of Patent: Aug. 1, 1995

[54] ABSOLUTE ROTARY ENCODER WITH SLIT PATTERNS HAVING BIT-CODED TRACKS RANGING FROM HIGHER TO LOWER ORDER

[75] Inventors: Masaaki Takagi; Takumi Fukuda, both of Tokyo, Japan

[73] Assignee: Copan Company Limited, Tokyo, Japan

[21] Appl. No.: 157,190

[22] PCT Filed: Apr. 20, 1993

[86] PCT No.: PCT/JP93/00506
§ 371 Date: Dec. 15, 1993
§ 102(e) Date: Dec. 15, 1993

[87] PCT Pub. No.: WO93/21499
PCT Pub. Date: Oct. 28, 1993

[30] Foreign Application Priority Data
Apr. 22, 1992 [JP] Japan .................................. 4-129681
Apr. 22, 1992 [JP] Japan .................................. 4-129682

[51] Int. Cl.⁶ .............................................. G01D 5/34
[52] U.S. Cl. ........................... 250/231.18; 250/237 G; 341/13
[58] Field of Search ................. 250/231.18, 237 G; 341/13

[56] References Cited

U.S. PATENT DOCUMENTS

| | | | |
|---|---|---|---|
| 3,487,400 | 12/1969 | Ludewig, Jr. et al. | 340/347 |
| 4,152,579 | 5/1979 | Feinland | 235/92 GC |
| 4,636,079 | 1/1987 | Rieder et al. | 356/374 |
| 4,945,231 | 7/1990 | Ohya et al. | 250/231.14 |
| 5,091,643 | 2/1992 | Okutani et al. | 250/231.14 |

FOREIGN PATENT DOCUMENTS 63-234729  9/1988  Japan .
374328  3/1991  Japan .

*Primary Examiner*—David C. Nelms
*Assistant Examiner*—Steven L. Nichols
*Attorney, Agent, or Firm*—Sixbey, Friedman, Leedom & Ferguson

[57] ABSTRACT

An absolute encoder is comprised of a movable member formed thereon with a plurality of slit patterns to define a plurality of tracks ($T_1$, $T_2$) which are bit-coded according to a digital code system such as a binary coded quaternary system indicative of absolute addresses, and which are arranged in parallel manner from a higher order to a lower order. A light source irradiates an illuminating light onto the movable member. A pair of photodetector arrays 1, 2 receive the illuminating light through the slit patterns to output detection signals ($A_0^+$-$A_3^-$) for the respective tracks. A processing circuit processes the detection signals to produce bit signals ($P_0$-$P_3$) and to decode the same to read an absolute address of the movable member. This processing circuit has an operation circuit (3-20) for logically processing lower order detection signals ($A_0^+$, $A_0^-$) obtained from the lower order track $T_1$, with higher order detection signals ($A_2^+$-$A_3^-$) obtained from the higher order track $T_2$ to produce the higher order bit signals $P_2$, $P_3$ in synchronization with either of leading and trailing edges of the lower order bit signal $P_0$. In order to detect a great number of tracks, the illuminating light from the lower order tracks may be received through an expansion optical system, while the illuminating light from the higher order tracks may be received directly by the corresponding photodetector array.

22 Claims, 16 Drawing Sheets

FIG.14
(PRIOR ART)

ABSOLUTE ROTARY ENCODER WITH SLIT PATTERNS HAVING BIT-CODED TRACKS RANGING FROM HIGHER TO LOWER ORDER

TECHNICAL FIELD

The present invention relates to an absolute encoder for outputting an absolute positional signal in the form of a parallel bit code representative of an angular position of an encoder plate such as a rotary disc even though the rotary disc is held stationary. The present invention particularly relates to a synchronous control technology between a higher order bit signal and a lower order bit signal, and further relates to an optical detection structure of a slit pattern formed on the encoder plate such as the rotary disc.

BACKGROUND TECHNOLOGY

The encoder is widely utilized for a positional detection of a robot arm or else, and is constructed to read a scale of the encoder plate attached to a rotation shaft of a motor, by means of a detection element. The positional detection encoder includes an incremental type and an absolute type. The former type is constructed such as to read a position of the rotary disc by counting an incremental pulse with reference to an origin of the rotary disc. The latter type undergoes the positional detection by reading a code formed on the rotary disc regardless of a mechanical state thereof. Therefore, the incremental type needs to rotate at most one cycle to restore the origin when restarting the encoder operation after a power source has been shut down, whereas the absolute type advantageously does not need the origin restoring operation because the position can be instantly read without moving the rotary disc when the power source is recovered.

FIG. 13 shows a typical structure of the conventional absolute encoder. A rotary disc 101 is formed thereon with a plurality of concentric tracks 102-105. Each track is comprised of an annular slit pattern which is bit-coded according to a digital code system indicative of an absolute position of the rotary disc 101. A photodetector array 106 is opposed to one side of the rotary disc 101, and a. photoemitter such as an LED 108 is opposed to the other side of the disc through a stationary slit plate 107. The slit pattern formed in the rotary disc 101 selectively passes and cuts off a light beam from the LED 108 so that the photodetector array 106 outputs detection signals according to a light intensity variation on respective tracks of the array 106. These detection signals are processed so as to read the angular absolute position or angular address of the rotary disc 101. Namely, this address is represented by the aforementioned digital code.

There have been known various digital code systems for representing an address. FIG. 14 schematically shows a slit pattern formed according to a regular binary code which is one example of the digital code systems. The illustrated pattern diagram indicates track numbers in a left column and addresses in a top row. The slit pattern of each track is binarily coded, and is composed of bright and dark sections. In this example, there are provided four tracks corresponding to four bits so as to represent $2^4=16$ number of absolute addresses. Such a regular binary code is a basic arrangement in the digital process. However, at a transition from one address to another address, switching between adjacent bright and dark sections may occur concurrently at two or more tracks. It is quite difficult to just concurrently detect respective transitions, thereby causing the drawback that a reading error may be generated by transitional fluctuation of detection timings.

FIG. 15 shows Gray code which is designed to remove the above noted drawback. As seen from the pattern diagram, the Gray code is characterized in that the switching between adjacent bright and dark sections occurs only on one track at every transition of the addresses in contrast to the regular binary code, thereby effectively avoiding the reading error. However, the Gray code requires a multiple of tracks corresponding to a number of bits likewise the regular binary code. Therefore, as the bit number is increased to multiply addresses for achieving higher resolution power, a multiple of tracks are arranged in parallel manner along a radial direction of the rotary disc to thereby hinder down-sizing of the absolute encoder.

FIG. 16 shows a slit pattern formed according to a binary coded quaternary system which can effectively reduce a number of tracks by half. A pair of tracks "0" and "1" are assigned with two binary bits for representing a quaternary lower order. For example, addresses "0"-"3" belonging to a first group are discriminated from each other by the quaternary numbers of the lower order. Similarly, addresses "4"-"7" belonging to a second group are also discriminated from each other by the quaternary numbers of the lower order. The same is true for the remaining third and fourth groups. Another pair of tracks "2" and "3" are assigned with two binary bits for representing a higher order of the quaternary number. The first, second, third and fourth groups are discriminated from each other by the higher order of the quaternary numbers. This binary coded quaternary system can be readily converted into the regular binary system by a simple logical computation. For example, in the FIG. 16 arrangement, provided that a bit signal $P_0$ is obtained from the track "0", a bit signal 191 is obtained from the track "1", a bit signal 192 is obtained from the track "2", and a bit signal $P_3$ is obtained from the track "3", the first bit or the lowest order bit $B_0$ of the regular binary code is produced by exclusive logical OR operation of $P_0$ and $P_1$. The second bit $B_1$ is identical to $P_0$. The third bit $B_2$ is produced by exclusive logical OR operation of $P_2$ and $P_3$. The fourth or highest order bit $B_3$ is identical to $P_2$.

FIG. 17 shows two different arrangements of a photodetector array for reading the binary coded quaternary slit pattern. A left photodetector array 110 has four photodetectors arranged in line correspondingly to the respective tracks "0"-"3". On the other hand, a right photodetector array 111 has a pair of photodetectors arranged along the track "1" by a phase difference of 90° with each other relative to the periodic slit pattern of the track "1" This pair of photodetectors can read a quaternary number of the lower order. Similarly, another pair of photodetectors are arranged along the track "3" by a phase difference of 90° with each other so as to read a quaternary number of the higher order. By such an arrangement, unnecessary tracks "0" and "2" can be eliminated to thereby reduce the number of tracks by half. To facilitate better understanding to this point, supplementary description is given again with reference to FIG. 16. The pair of tracks "0" and "1" have periodic slit patterns having the same period but a relative phase difference of 90°. Accordingly as illustrated by FIG. 17, the first pair of photodetectors are shifted from each other by the phase difference of 90° to enable reading of all the information contained in the tracks "0" and "1". Namely, the first pair of photodetectors can receive four combinations of bright and bright, bright and dark, dark and bright, and dark and dark to read the quaternary information. In similar manner, the tracks "2" and "3" shown in FIG. 16 have periodic slit patterns having the same period but a relative phase difference of 90°. Therefore, the arrangement of the photodetector array 111 of FIG. 17 can read quaternary information of the higher order. Further, a plurality of photodetector arrays 111 may be arranged periodically along the periodic slit patterns to ensure a sufficient intensity of the received light. For the simplicity, the above description is directed to the relative relation between the photodetector array and the tracks in the FIG. 17 diagram. Practically, a stationary mask plate may be utilized to define desired photodetecting areas in place of separated photodetectors. As described above, the binary coded quaternary slit pattern can effectively reduce the number of tracks by half. However, switching between the bright and dark sections may occur concurrently on two or more of the parallel tracks in contrast to the previous Gray code pattern. Therefore, the binary coded quaternary pattern still suffers from the transitional reading error.

As opposed to the above noted code patterns which need a plurality of parallel tracks, another type of the absolute encoder utilizes a single track, as disclosed for example in Japanese Patent Application Laid-Open No. 3-6423. As shown in FIG. 18, a rotary disc has a single absolute track formed with bright and dark slits arranged at different pitches, and patterned according to M-sequence code. A photodetector array is provided circumferentially to read an absolute address of the rotating disc. However, the M-sequence slit pattern does not have a periodic structure, hence a multiple of photodetector arrays cannot be disposed in the circumferential direction, thereby failing to raise the received light amount. Consequently, it would be difficult to achieve high resolution because a sufficient light amount is not obtained.

In view of the above noted drawbacks of the prior art, a first object of the invention is to reduce a number of tracks for down-sizing and higher resolution, while maintaining a sufficient amount of received light by multiple photodetection along a periodical slit pattern and removing a reading error. Particularly, the present invention is directed to removal of the reading error.

Referring back to FIG. 13, brief description is given to another problem of the prior art to be solved. For the simplicity, the four number of tracks are formed on the rotary disc 101 in the exemplified FIG. 13 prior art. Each track is recorded with a one-bit data so that the rotary disc 101 is written with absolute addresses composed of four-bit parallel data. Only sixteen absolute addresses are designated by the four-bit parallel data. Practically, a rotary disc is recorded with 12-bit or 16-bit parallel data to obtain high resolution power. In such a case, the lowest order track has a quite fine slit pattern pitch which is $\frac{1}{2}^{12}$ or $\frac{1}{2}^{16}$ as short as that of the highest order track. However, an actual minimum pitch is limited over a certain dimension. If the slit pattern pitch is reduced to the order of micron meter, incident light beam may be diffracted to seriously degrade S/N ratio. Accordingly, the FIG. 13 optical system utilizing the linearity of the light has a lower limit of the minimum slit pattern pitch. In a higher resolution mode, slit pattern pitches of respective tracks are set proportionally to the minimum pattern pitch of the lowest order track, so that the slit pattern pitch of the highest order track is made significantly long. A diameter of the rotary disc must be enlarged in order to contain such a long pitch slit pattern circumferentially of the disc, thereby hindering scale-down of the absolute encoder. Further, a certain radial space must be provided between adjacent tracks in order to avoid interference of incident illuminating lights between the tracks. The higher the resolution power, the greater the number of tracks, resulting in more need for a space adversely which enlarges the diameter of the rotary disc, thereby hindering scale-down of the absolute encoder.

In view of the above noted drawbacks of the prior art, a second object of the invention is to improve an optical system of the absolute encoder to realize micronization of the slit pattern to thereby achieve higher resolution power and further scale-down of the absolute encoder.

DISCLOSURE OF THE INVENTION

In order to achieve the above noted first object, according to the invention, the absolute encoder is basically comprised of a movable member formed thereon with a plurality of slit patterns to define a plurality of tracks bit-coded according to a given digital code system representative of absolute addresses of the movable member, the tracks being arranged in parallel manner from a higher order to a lower order, a light source for irradiating an illuminating light onto the movable member, photodetecting means receptive of the illuminating light through the slit patterns to output detection signals originating from the respective tracks, and processing means for processing the detection signals to reproduce bit signals and for decoding the bit signals to read an absolute address of the movable member. The absolute encoder is characterized in that the processing means includes operation means for logically processing a lower order detection signal obtained from a lower track with a higher order detection signal obtained from a higher order track to reproduce a higher order bit signal in synchronization with either of leading and trailing edges of a lower order bit signal. By such a construction, the higher order bit signal is synchronized with the lower order bit signal to remove a reading error of the absolute address.

Further, in order to achieve the above noted second object, according to the invention, the absolute encoder is basically comprised of a movable member such as a rotary disc formed thereon with a plurality of slit patterns to define a plurality of tracks bit-coded to record absolute addresses, the tracks being arranged in parallel manner from a higher order to a lower order, a light source for irradiating an illuminating light onto the movable member, photodetecting means for receiving the illuminating light through the slit patterns to output detection signals originating from the respective tracks, and processing means for processing the detection signals to reproduce bit signals so as to read an absolute address of the movable member. The absolute encoder is characterized in that the photodetecting means is divided into two parts disposed in alignment with lower order tracks and higher order tracks, respectively. The one part receives an expanded component of the illuminating light from the lower order tracks by means of an expansion optical system while the other part receives a remaining component of the illuminating light directly from the higher order tracks. Preferably, the processing means includes means for synchronizing a lower order bit signal and a higher order bit signal with each other. By such a construction, an illuminated image of the slit patterns formed along the lower order tracks is not directly received, but is received through the expansion optical system. A bright and dark image of the expanded or magnified slit pattern has a sufficient contrast effective to avoid degradation of S/N ratio. Consequently, a slit pattern pitch of the lowest order track can be micronized to a limit of geometrical optics, thereby realizing scale-down of the rotary disc. Further, in order to compensate for the separation of the photodetecting means to the lower and higher order tracks, the lower and higher bit signals are synchronized to each other so as to avoid a reading error of the absolute address.

BRIEF DESCRIPTION OF THE DRAWINGS

Figure 14:
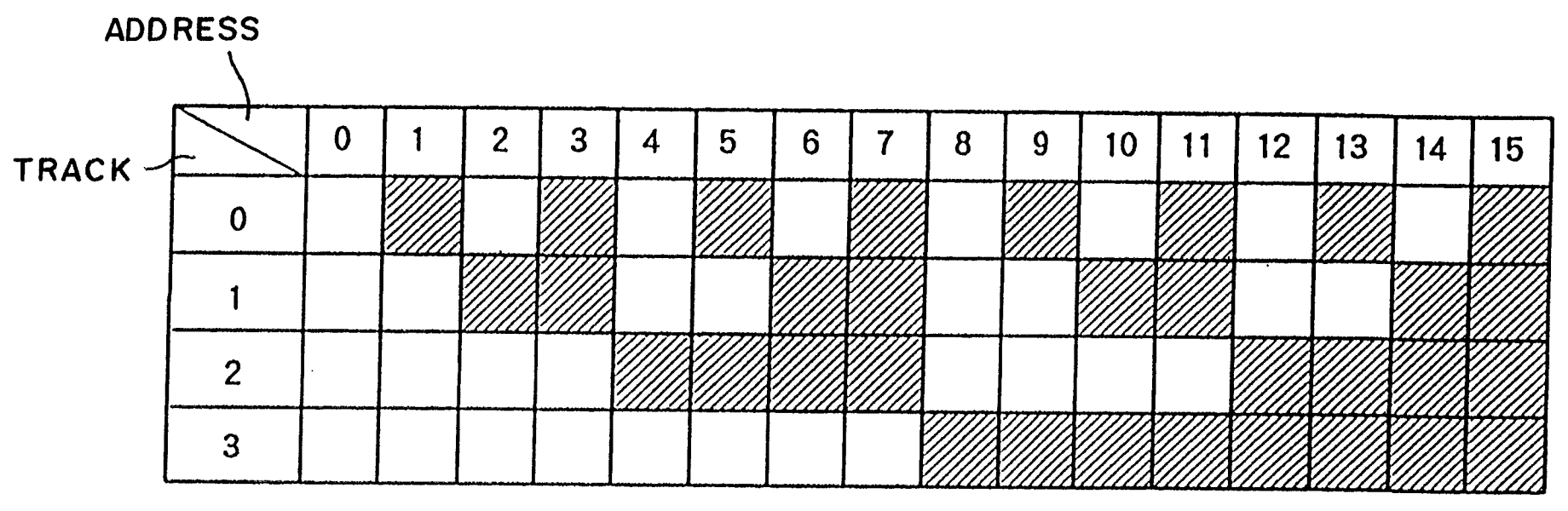

FIG. 14 is a schematic diagram showing a slit pattern formed according to a regular binary coding system.

BEST MODES OF PRACTICING THE INVENTION

Figure 1:
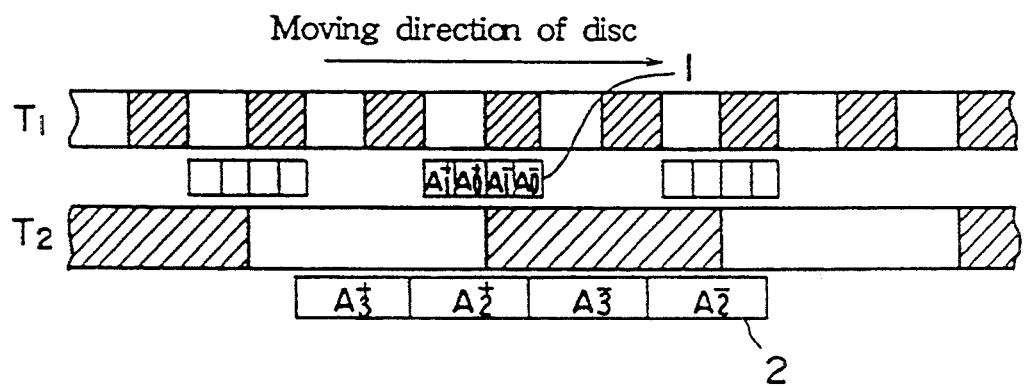
FIG. 1 is a diagram schematically showing slit patterns of an absolute encoder according to the invention.

The present invention will be described in detail with reference to the attached drawings. FIG. 1 shows a pair of tracks $T_1$ and $T_2$ formed on a movable member such as a rotary disc along its moving direction. This embodiment adopts slit patterns bit-coded according to the binary coded quaternary system such that the track $T_1$ represents a quaternary lower order and the track $T_2$ represents a quaternary higher order. A photodetector array 1 is disposed along the track $T_1$. This photodetector array 1 has a pair of photodetecting areas $A_1^+$ and $A_0^+$ which are phase-shifted from each other by 90°. Another pair of photodetecting areas $A_1^-$ and $A_0^-$ are also formed, which are phase-shifted from each other by 90°. These pairs have opposite phases to each other, hence "+" and "−" signs are used to discriminate therebetween. A multiple of the photodetecting arrays 1 are disposed periodically in correspondence to a period of a bright and dark slit pattern of the track $T_1$ to constitute integrated photodetecting means. By such a manner, the multiple of the photodetector arrays can collect sufficient amount of incident light. On the other hand, the higher order track $T_2$ is formed with a bright and dark slit pattern having a period four times as long as that of the lower order track $T_1$. A multiple of photodetector arrays 2 are disposed in correspondence to the slit pattern period though only one array is illustrated. The photodetector array 2 includes a pair of photodetecting areas $A_3^+$ and $A_2^+$ phase-shifted relatively from each other by 90°, and another pair of photodetecting areas $A_3^-$ and $A_2^-$ likewise phase-shifted relatively by 90°. These pairs are phase-shifted from each other by 180°. In addition, each photodetecting area of the array 2 has a certain span, i.e., a width extending in the track direction, which is dimensioned identical to the period of the lower order track $T_1$. Such an arrangement can achieve a maximum tolerance for a slit pattern pitch variation among the tracks.

Figure 2:
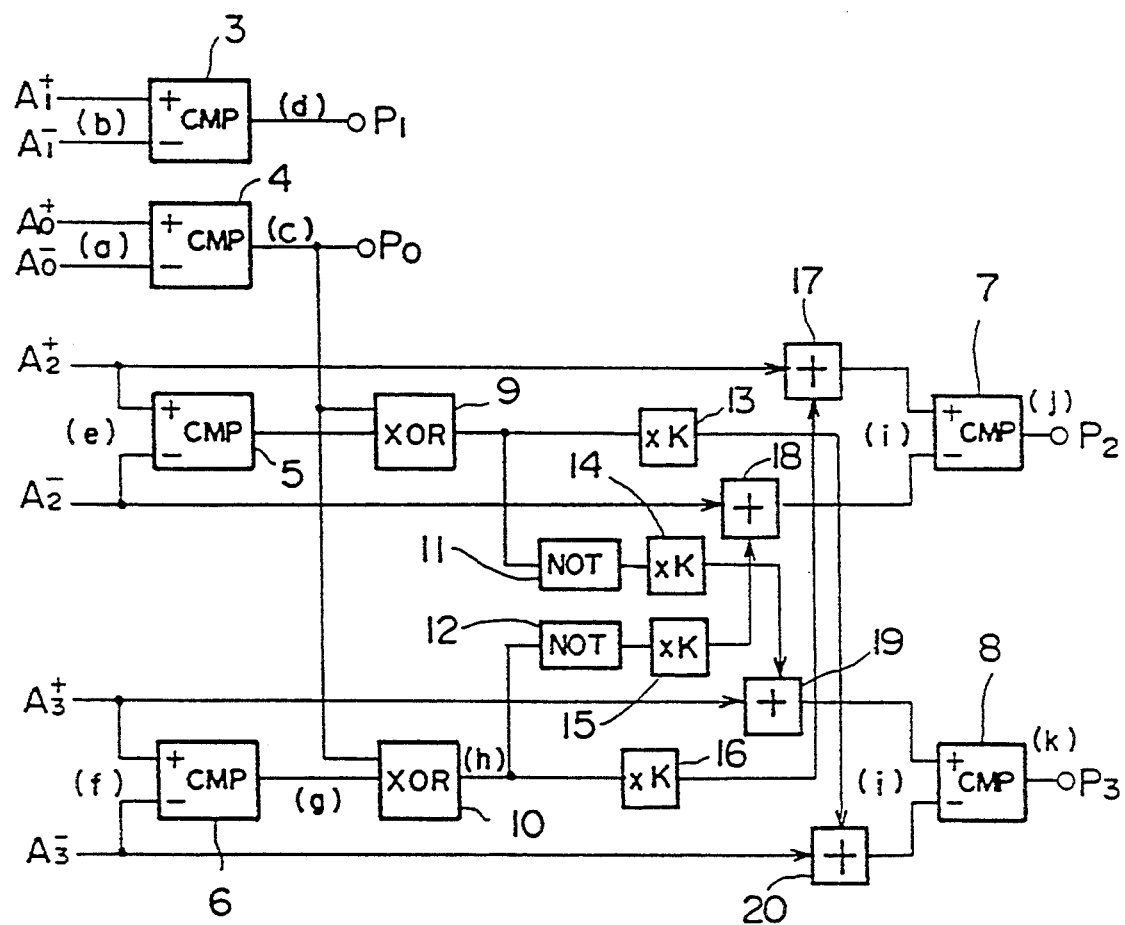
FIG. 2 is a block diagram showing a processing circuit construction of the inventive absolute encoder.

FIG. 2 shows a processing circuit connected to the photodetector arrays 1, 2. The processing circuit receives detection signals outputted from the respective photodetecting areas. For better understanding, each detection signal is labeled by the same reference as that of the corresponding photodetecting area. This processing circuit logically processes the detection signals $A_0^+$–$A_3^-$ to reproduce bit signals $P_0$, $P_1$, $P_2$ and $P_3$ according to the binary coded quaternary system. Though not shown, the circuit includes means for decoding the bit signals represented by the binary coded quaternary system to generate a signal indicative of an absolute address of the rotary disc, represented by the regular binary code. Further, according to the invention, this processing circuit includes operation means for logically processing lower order detection signals $A_0^+$ etc. obtained from the lower order track $T_1$ with the higher order detection signals $A_2^+$–$A_3^-$ obtained from the higher order track $T_2$, so as to reproduce higher order bit signals $P_2$, $P_3$ in synchronization with either of a leading edge or a trailing edge of a lower order bit signal such as $P_0$. This operation means is comprised of a plurality of comparators (CMP) 3-8, a pair of exclusive OR operators (XOR) 9, 10, a pair of inverters (NOT) 11, 12, four multipliers (×K) 13-16, four adders (+) 17-20 and so on, those of which are connected to each other as shown in FIG. 2. The thus constructed operation means includes logic means (for example, the exclusive OR operator 10) for logically processing a lower order compared signal (for example, the lower order bit signal $P_0$) which is obtained by comparing with each other a pair of lower order detection signals (for example, $A_0^+$ and $A_0^-$) having opposite phases, with an intermediate signal obtained by comparing with each other a pair of higher order detection signals (for example, $A_3^+$ and $A_3^-$) having opposite phases, adder means (for example, the multiplier 16 and adder 17) for adding the above logically processed signal and another higher order detection signal (for example, $A_2^+$) with each other by a given proportion (K), and reproduction means (for example, comparator 7) for comparing the above added signal $SA_2^+$ with an inverted signal $SA_2^+$ thereof to reproduce a synchronized higher order bit signal (for example, $P_2$).

Figure 3:
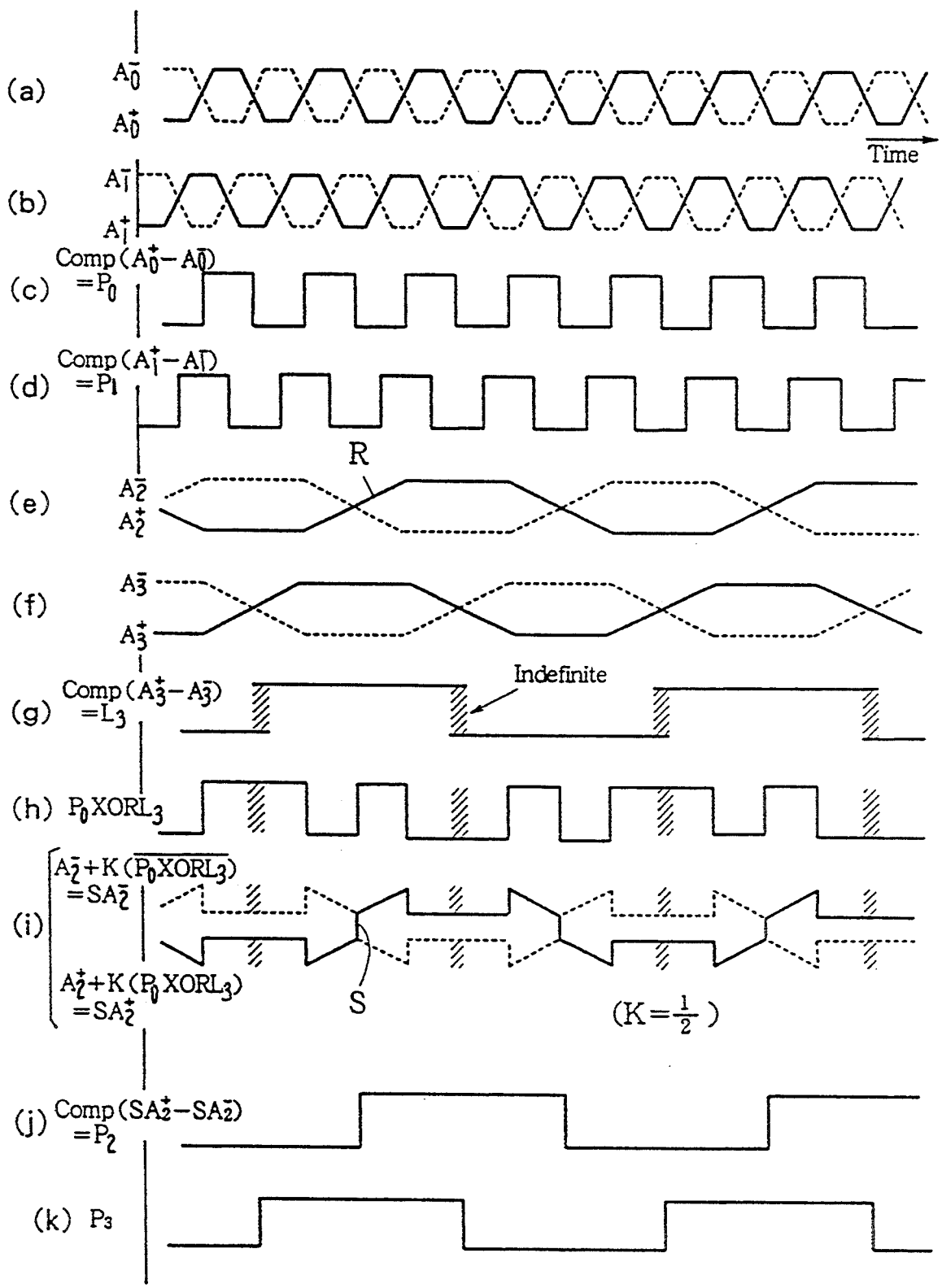
FIG. 3 is a waveform chart illustrating operation of the FIG. 2 circuit.

Next, detailed description is given to operation of the FIG. 2 processing circuit in conjunction with a waveform diagram of FIG. 3. A waveform (a) shows a pair of lower order detection signals $A_0^-$, $A_0^+$ having the opposite phases. Each of the order lower detection signals $A_0^-$, $A_0^+$ has relatively sharp leading and trailing edges in response to passage of the bright and dark slit pattern. A waveform (b) shows another pair of lower order detection signals $A_1^-$, $A_1^+$ having the opposite phases. This waveform (b) is phase-shifted from the other waveform (a) by 90°. A waveform (c) shows a lower order compared signal which is obtained by comparing with each other the lower order detection signals $A_0^-$, $A_0^+$ having the opposite phases by means of the comparator 4, and which directly represents the lowest order bit signal $P_0$. A waveform (d) shows another compared signal which is obtained by comparing with each other another pair of lower order detection signals $A_1^+$, $A_1^-$ having the opposite phases by means of the comparator 3, and which directly represents a second low order bit signal $P_1$. These pair of bit signals $P_0$, $P_1$ have rectangular waveforms having the relative phase difference of 90°.

A waveform (e) shows a pair of higher order detection signals $A_2^-$, $A_2^+$ having the opposite phases. These signals have a relatively dull leading and trailing edges in response to passage of the bright and dark slit pattern of the higher order track $T_2$. Their slanting degree depends on the span of each photodetecting areas provided in the array 2. The longer the span, the more flat the slanting edge R. A waveform (f) represents another pair of higher order detection signals $A_3^-$, $A_3^+$ having the opposite phases. Similarly, the waveform (f) has relatively dull leading and trailing edges, and is phase-shifted from the waveform (e) by 90°. A waveform (g) shows a compared signal $L_3$ which is obtained by comparing the pair of higher order detection signals $A_3^+$, $A_3^-$ with each other by means of the comparator 6. This signal $L_3$ has varying and indefinite leading and trailing edges, and is therefore asynchronous to the lower order bit signals $P_0$, $P_1$ so that a reacting error would occur. This indefiniteness is caused by relative dislocations of the photodetecting areas or inconsistency of the bright and dark slit patterns of the disc among the parallel tracks.

A waveform (h) shows a signal $P_0XORL_3$ which is obtained by processing the lowest order bit signal $P_0$ and the compared signal $L_3$ with each other by means of the exclusive OR operator 10. This waveform has either of sharp leading and trailing edges in a central portion of each period independently from the indefinite edges involved in the signal $L_3$. A waveform (i) shows a signal $SA_2^+$ which is obtained by adding the higher order detection signal $A_2^+$ to a multiplied form of the signal $P_0XORL_3$ processed by the multiplier 16 with a given multiplication factor K, and another signal $SA_2^-$ which is obtained by adding the other higher order detection signal $A_2^-$ to a multiplied form of an inverted signal $\overline{P_0XORL_3}$ processed by the multiplier 15 with the given multiplication factor K. The signal $SA_2^+$ has a vertical step S of a certain height in a central portion of each period. The height of the step S is determined by the factor K, such that setting of K=0.5 realizes an optimum state effective to suppress the reading error.

A waveform (j) shows the third higher order bit signal $P_2$ which is obtained by comparing the above mentioned signals $SA_2^+$ and $SA_2^-$ with each other by means of the comparator 7. In similar manner, a waveform (k) shows the fourth highest order bit signal $P_3$ which is produced at an output terminal of the comparator 8. For example, the higher order bit signal $P_2$ rises at the vertical step S shown in the waveform (i). This rising edge is perfectly synchronized with the trailing edge of the lowest order bit signal $P_0$. The degree of the slanting edge R is optimumly set so as to achieve a maximum tolerance for the reading error. As described before, the slanting degree is optimized if the photodetecting area span corresponding to the higher order track is set identical to the period of the bright and dark slit pattern of the lower order track. In this optimum condition, the higher order truck is allowed a maximum error in the order of half a period of the lower order track.

Figure 4:
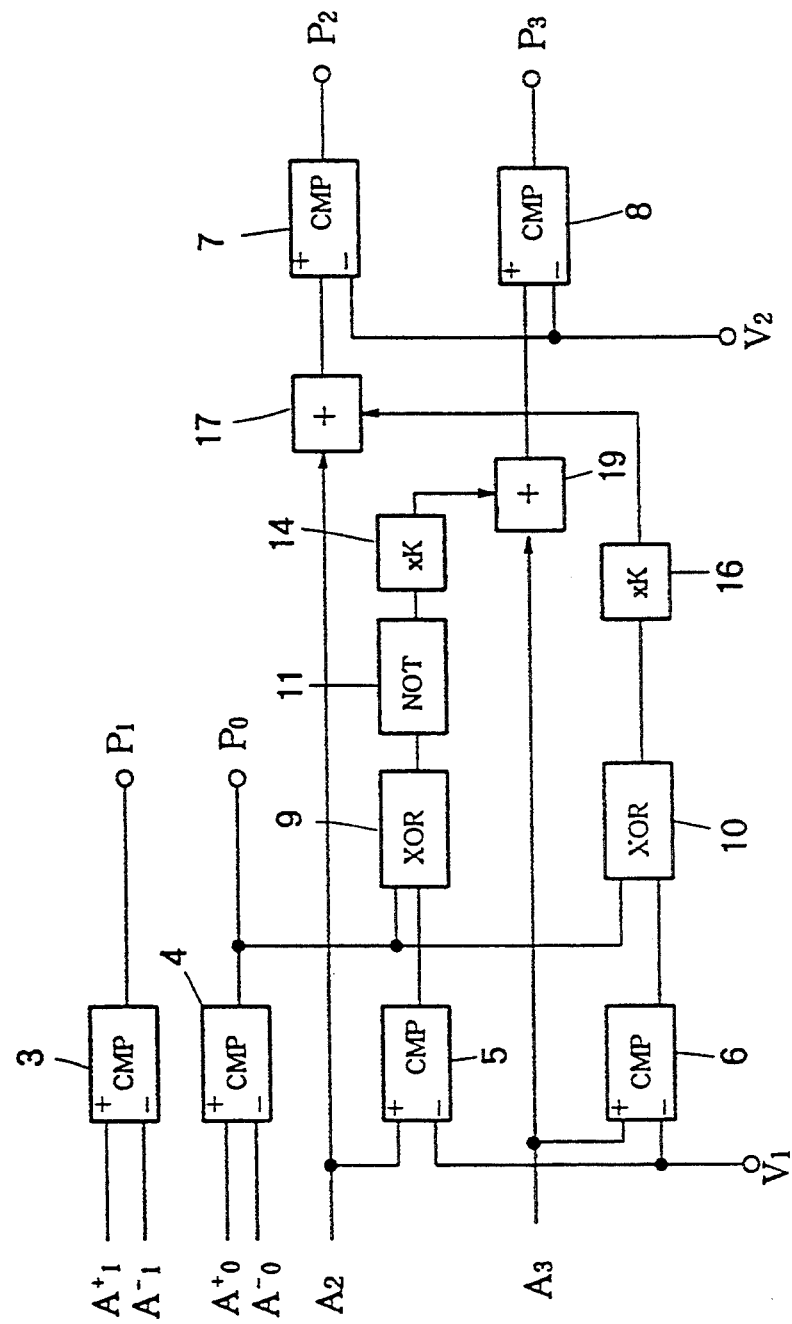
FIG. 4 is a block diagram showing a modification of the FIG. 2 circuit.

In the embodiment shown in FIGS. 1 and 2, the photodetector array 2 is provided with the four photodetecting areas for obtaining higher order detection signals of different phases. However, two photodetecting areas for producing inverted detection signals are not indispensable, and therefore may be eliminated. It would be expedient to adopt a modified processing circuit which is dispensed of inverted detection signals for a higher order track to realize the scale-down and the reduction of element number, in view of the fact that the higher order track has a relatively large allowance of the error. Such a modification is shown in FIG. 4. Basically, the modified circuit has the same structure as the FIG. 2 circuit. Specifically, predetermined reference voltages $V_1$, $V_2$ are utilized in place of the inverted higher order detection signals $A_2^-$ and $A_3^-$.

Figure 5:
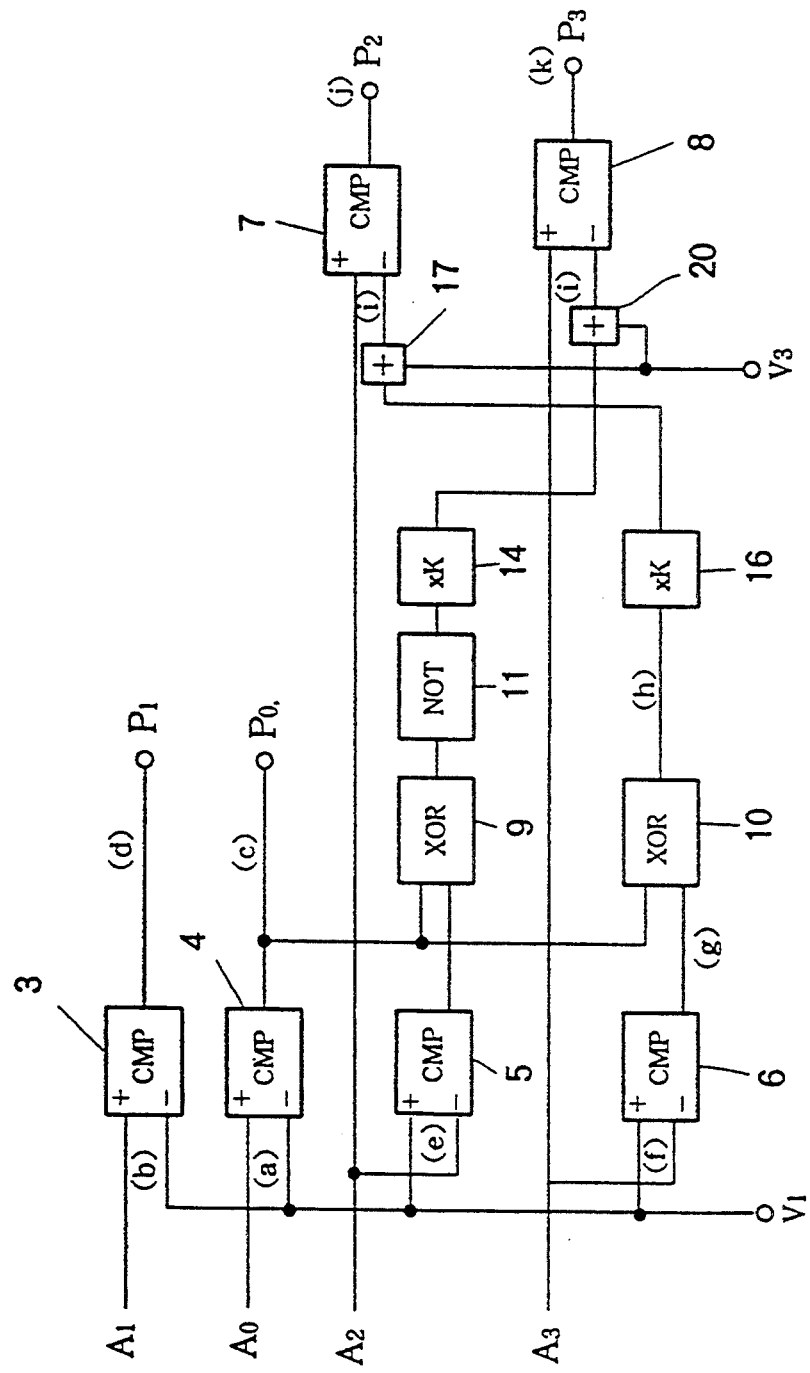
FIG. 5 is a block diagram showing another modification of the FIG. 2 circuit.

FIG. 5 shows another modification which is obtained by simplifying the FIG. 2 circuit construction. In this modification, a given reference voltage $V_1$ is applied to the lower order detection signals as a threshold level to produce the lower order bit signals $P_0$ and $P_1$. Further, another given reference voltage $V_3$ is utilized for shaping of the higher order bit signals $P_2$ and $P_3$, thereby simplifying the circuit construction. Hereinafter, the specific description is given to characteristic points. The present processing circuit includes logic means (for example, exclusive OR operator 10) for logically processing with each other those of a lower order compared signal/for example, the lower order bit signal $P_0$) which is obtained by comparing with each other a lower order detection signal (for example, $A_0$) and the reference voltage $V_1$, and a higher order compared signal which is obtained by comparing with each other a higher order detection signal (for example, $A_3$) and the reference voltage $V_1$, adder means (for example, multiplier 16 and adder 17) for adding the logically processed signal and the other reference voltage $V_3$ with each other by a given proportion (K), and reproduction means (for example, comparator 7) for comparing the added signal with another higher order detection signal (for example, $A_2$) to reproduce a synchronized higher order bit signal (for example, $P_2$).

Figure 6:
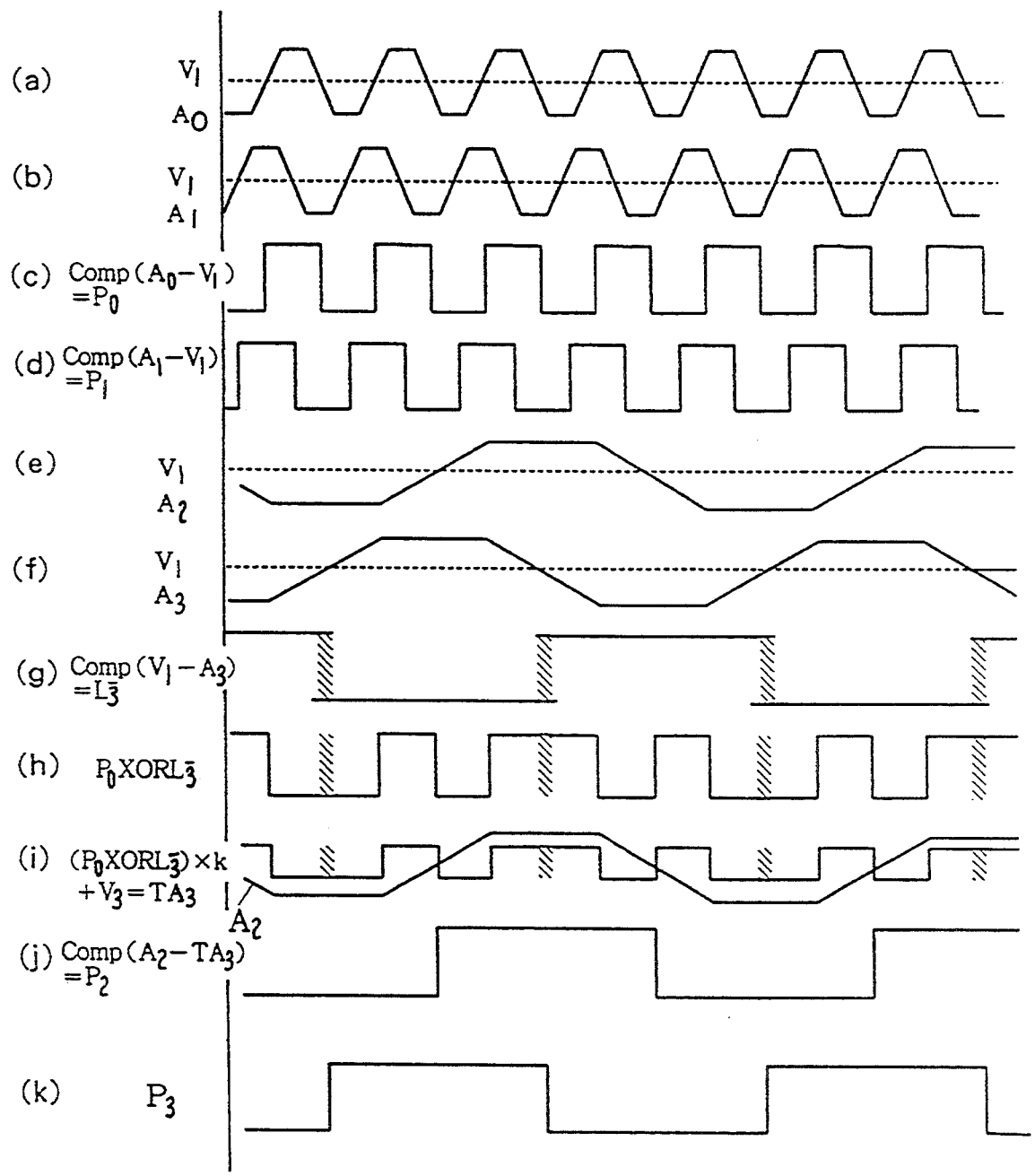
FIG. 6 is a waveform chart illustrating operation of the FIG. 5 circuit.

Next, the detailed description is given to operation of the FIG. 5 processing circuit in conjunction with waveforms shown in FIG. 6. A waveform (a) shows the lower order detection signal $A_0$ and the reference voltage $V_1$. The lower order detection signal $A_0$ has relatively sharp leading and trailing edges in response to passage of the bright and dark slit pattern. A waveform (b) shows the other lower order detection signal $A_1$ and the reference voltage $V_1$. This lower order detection signal $A_1$ is shifted by a phase angle of 90°. A waveform (c) represents a compared signal which is obtained by comparing the lower order detection signal $A_0$ with the reference voltage $V_1$ by means of the comparator 4, and therefore which directly represents the lowest order bit signal $P_0$. A waveform (d) shows another compared signal which is obtained by comparing the other lower order detection signal $A_1$ with the reference voltage $V_1$ by means of the comparator 3, and therefore which directly represents the second lower order bit signal $P_1$. These pair of the low order bit signals $P_0$, $P_1$ have the same rectangular waveform, and are phase-shifted relatively by 90°.

A waveform (e) shows the higher order detection signal $A_2$ having relatively dull leading and trailing edges in response to passage of the bright and dark slit pattern of the higher order track $T_2$. A waveform (f) shows the other higher order detection signal $A_3$ which has similarly dull leading and trailing edges, and which is phase-shifted from the signal $A_2$ by 90°. A waveform (g) shows a signal $L_3^-$ which is obtained by comparing the higher order detection signal $A_3$ with the reference voltage $V_1$ by means of the comparator 6. This signal $L_3^-$ has varying and indefinite leading and trailing edges, and is therefore asynchronous to either of the lower order bit signals $P_0$, $P_1$ so that the reading error would not be removed in this stage.

A waveform (h) shows a signal $P_0 XOR L_3^-$ which is obtained by processing the lower order bit signal $P_0$ and the above mentioned signal $L_3^-$ with each other by means of the exclusive OR operator 10. This signal contains a sharp leading edge or a sharp trailing edge in a central portion of each period independently from the indefinite edges appearing in the signal $L_3^-$. A waveform (i) represents a signal $TA_3$ which is obtained by adding the reference voltage $V_3$ to a multiplied form of the signal $P_0 XOR L_3^-$ processed by the multiplier 16 with a given multiplication factor K. The waveform (i) further shows another higher order detection signal $A_2$. A waveform (j) represents the third higher order bit signal $P_2$ which is obtained by comparing the signals $TA_3$ and $A_2$ with each other by means of the comparator 7. In similar manner, a waveform (k) represents the fourth highest order bit signal $P_3$ which is produced at an output terminal of the comparator 8.

Figure 7:
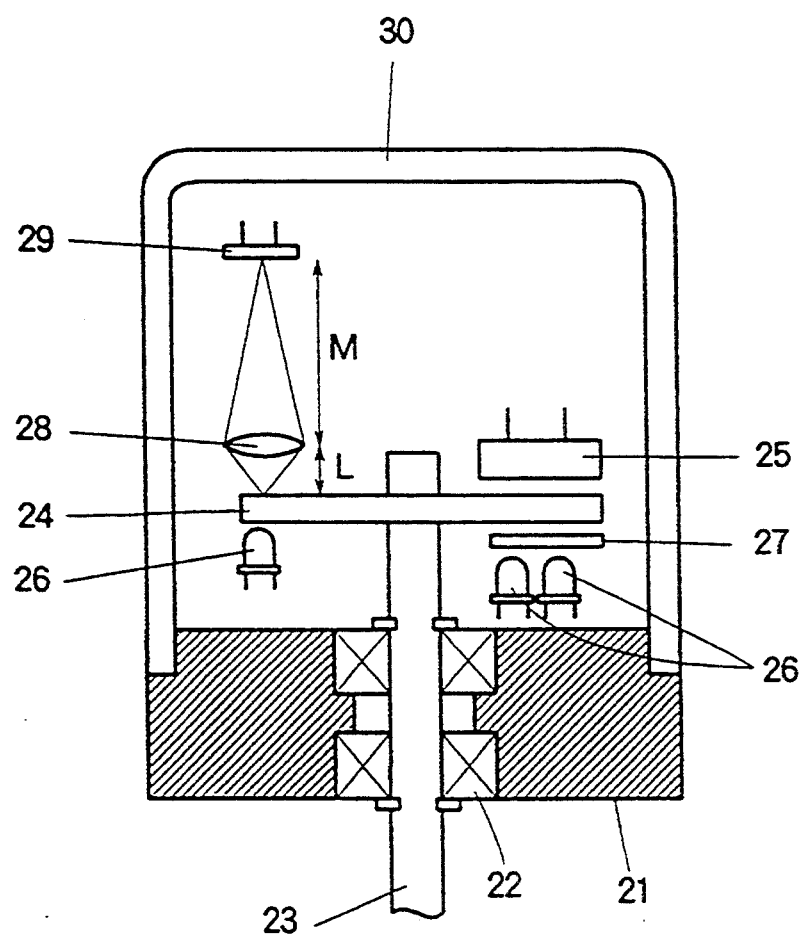
FIG. 7 is a sectional diagram showing an overall construction of the inventive absolute encoder.

Next, referring to FIG. 7, the description is given to one embodiment of a rotary encoder having a 16-bit address arrangement according to the invention. A base 21 supports centrally a shaft 23 through bearings 22. A rotary disc 24 is attached to a top end of the shaft 23. The disc 24 is formed thereon with a plurality of concentric tracks recorded with the 16-bit addresses. Lower order tracks are arranged radially outward of the disc and higher order tracks are arranged radially inward. A photodetector array 25 and a light source 26 are opposed to each other through the disc 24 in registration with the higher order tracks. Further, a stationary mask plate 27 is interposed between the light source 26 and the disc 24. The photodetector array 25 directly receives an illuminating light which passes the higher order tracks and the stationary mask plate 27 to thereby produce higher order detection signals for the respective higher order tracks. On the other hand, an imaging lens 28 is opposed to the lower order tracks. Another photodetector array 29 is disposed in alignment with an expanding image plane of the lens 28. An image of the lower order tracks illuminated by the light source 26 is expanded or enlarged by a ratio of M/L. The lowest order track is formed with an extremely fine bright and dark slit pattern as compared to that of the highest order track. It would be practically difficult to form an extremely fine stationary mask pattern and an extremely fine photodetector array in perfect registration with such a fine slit pattern by one-to-one relation. Optical diffraction or else would be generated to degrade S/N ratio of the detection signal to thereby cause reading error. In view of this, the present embodiment applies an expansion image optical system to the lower order tracks to achieve practical detection of the fine slit pattern. The above listed various optical elements are mounted on the base 21, and are encapsulated within a cap 30.

Figure 8:
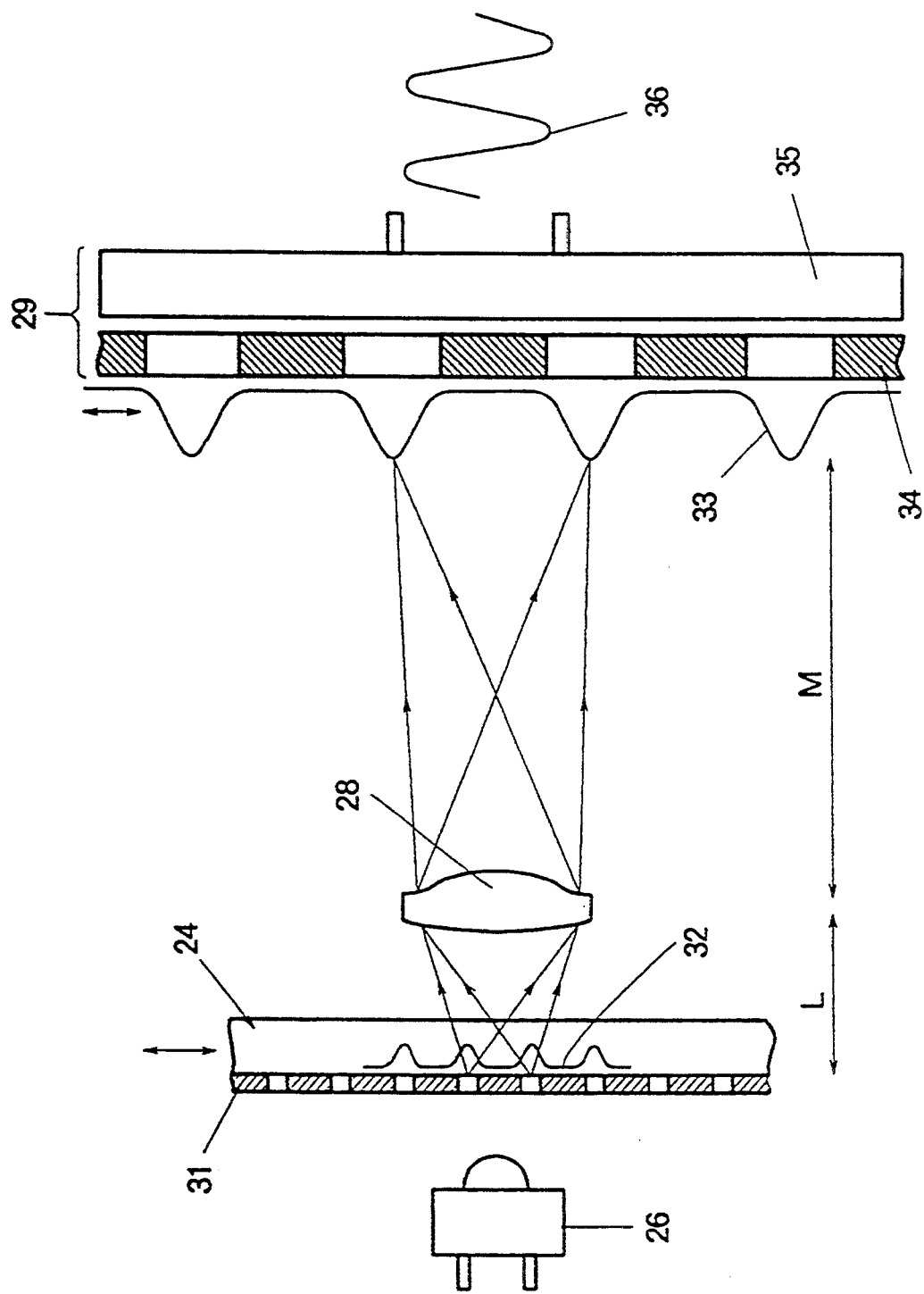
FIG. 8 is a geometric optical diagram illustrating operation of an expansion optical system provided in the FIG. 7 absolute encoder.

Referring to FIG. 8, the expansion optical system will be described in detail in association with the photodetector array. A fine slit pattern 31 of a lower order track is formed circumferentially of the rotary disc 24. The light source 26 such as an LED illuminates the slit pattern 31 to produce a primary bright and dark image 32 which moves along a first plane. The first plane is disposed at a distance L in the optical axis direction with respect to the imaging lens 28. The primary bright and dark image 32 has an identical peak pitch to a period of the slit pattern 31. This primary bright and dark image 32 is expandingly projected by the lens 28 to form a secondary bright and dark image 33 on a second plane. The second plane is disposed at a distance M with respect to the imaging lens 28 in the optical axis direction. These distances L and M are calculated according to a lens formula $L/M + L/L = L/F$, where F denotes a focal length of the imaging lens 28. As understood from the lens formula, the magnification rate of the secondary image 33 relative to the primary image 32 is given M/L.

On the other hand, the photodetector array 29 is composed of a laminate of a stationary mask plate 34 and a planar photodetector 35. As indicated by the arrow, the secondary image 33 moves as the primary image 32 moves. Each peak of the moving secondary image 33 is intermittently received by the photodetector 35 through the stationary mask plate 34 to output an AC detection signal 36 according to periodical variation in the received light amount. By such a construction, there can be obtained a high resolution encoder utilizing the optical linearity while the photodetector array 29 is spaced away from the rotary disc 24. The slit pattern 31 on the first plane is micronized for the higher resolution, while the mask pattern on the second plane is not required a fine slit. The above mentioned magnification rate is applied also to the relation between the slit pattern period and the mask pattern period. The use of the expansion optical system attributes not only to higher resolution and micronization of the slit pattern, but also to reduction in radial width of individual tracks as compared to the prior art, thereby achieving scaledown of the rotary disc.

Figure 9:
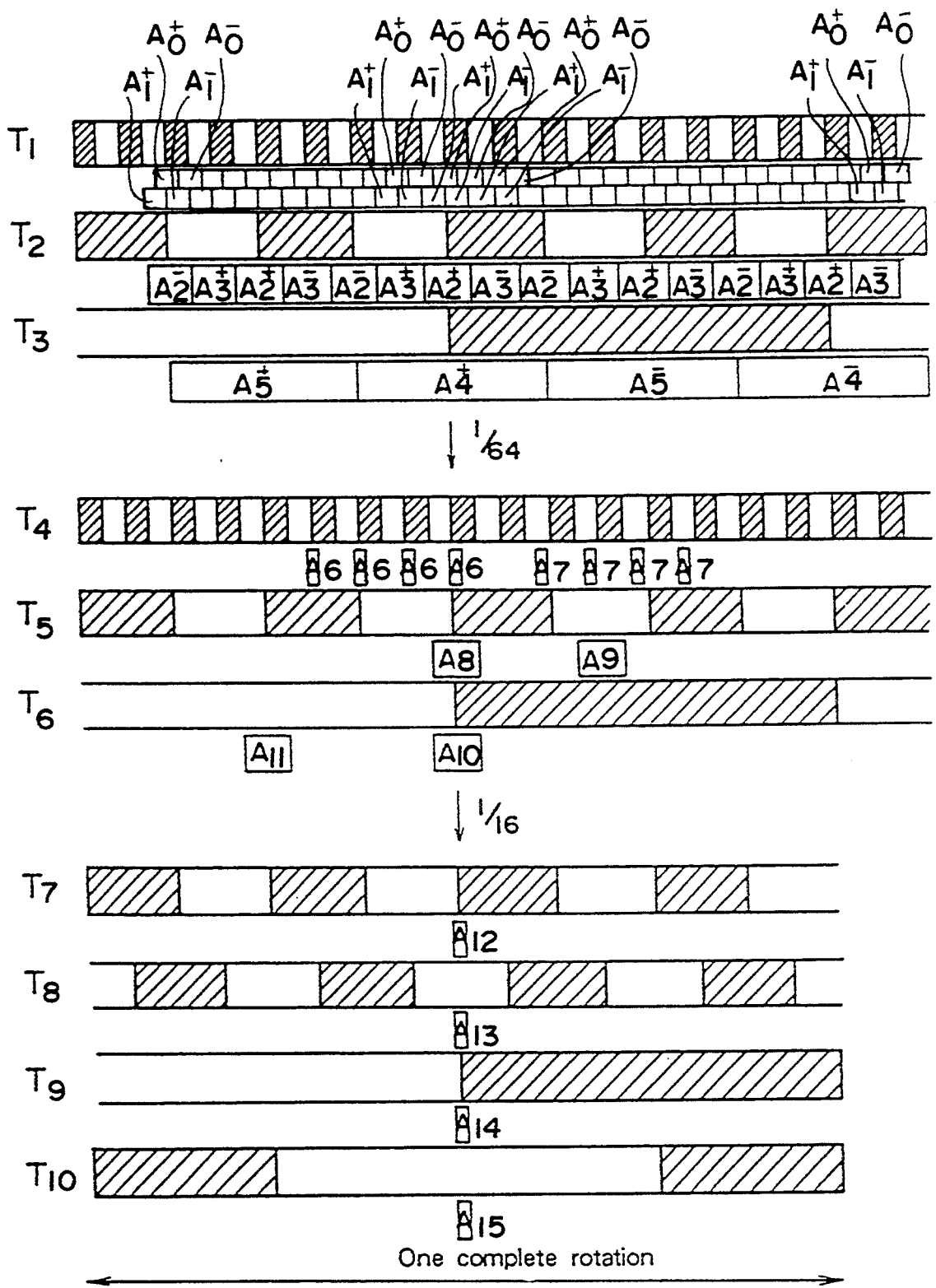
FIG. 9 is a diagram showing an example of slit patterns along tracks formed on a rotary disc of the inventive absolute encoder.

Next, referring to FIG. 9, description is given to an example of slit patterns of the multiple tracks formed on the rotary disc and to an associated arrangement of the photodetecting areas. The 16-bit addresses are recorded on ten number of tracks which are labeled $T_1$-$T_{10}$ from a lower order to a higher order. The three of the lowest tracks $T_1$, $T_2$ and $T_3$ are formed with slit patterns according to the binary coded quaternary system. Further, the fine slit patterns are optically detected through the expansion optical system. Moreover, photodetecting areas are arranged to output detection signals of different phases. In addition, a multiple of the photodetecting areas are disposed throughout the entire length of the array to increase the received light amount. The two lowest order bit signals $P_0$, $P_1$ are obtained from the track $T_1$. Next two lower order bit signals $P_2$, $P_3$ are obtained from the track $T_2$. Further next two bit signals $P_4$, $P_5$ are obtained from the track $T_3$. By such a manner, the six number of the lower order bit signals are produced in total from the tracks $T_1$–$T_3$.

Figure 10:
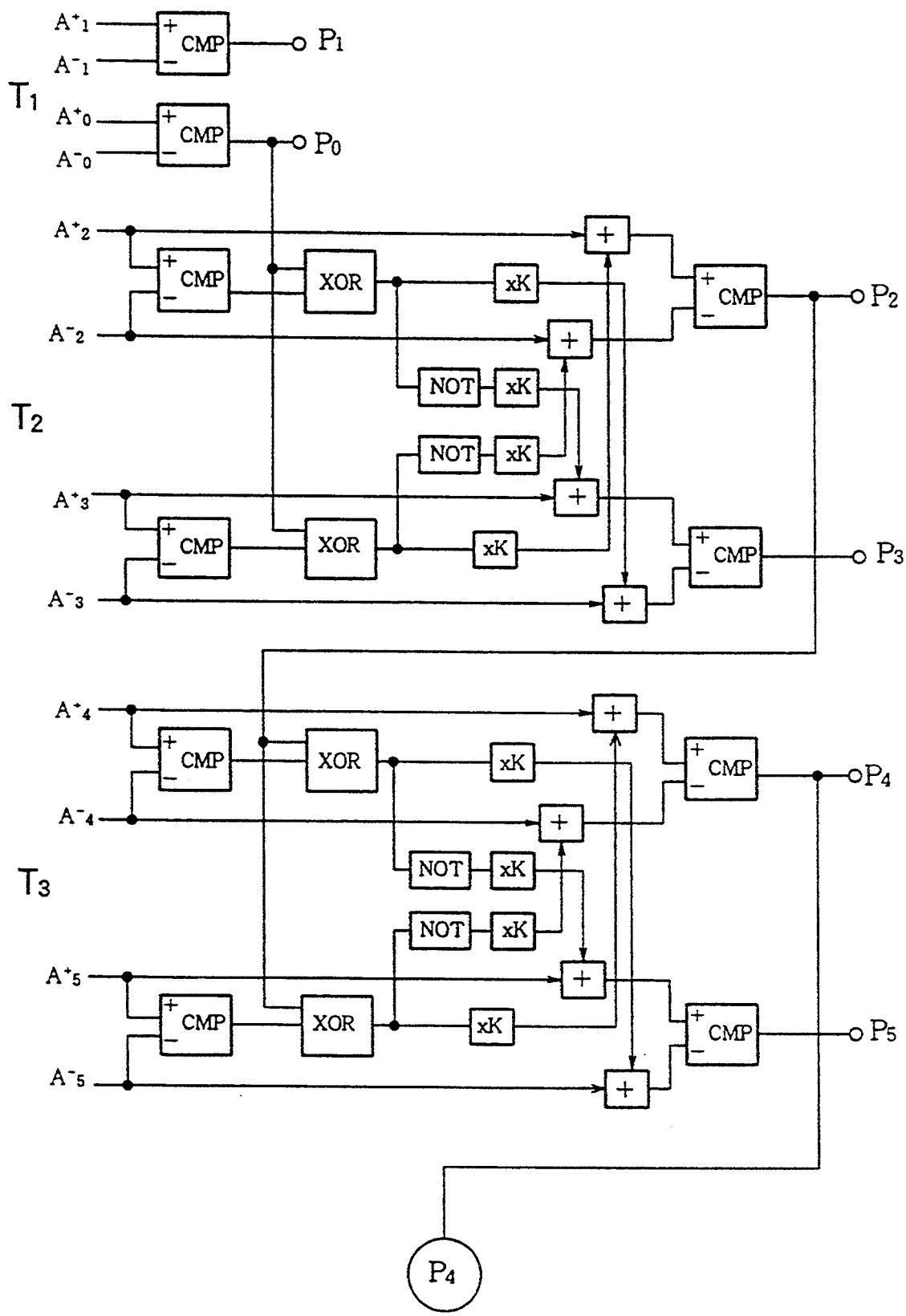
FIGS. 10-12 are a block diagram showing a circuit construction adopted for the slit patterns shown in FIG. 9.

FIG. 10 is a block diagram showing a processing circuit installed to synchronize the six lower bit signals with each other. The circuit is basically comprised of two stages of the FIG. 2 construction. The two of bit signals $P_2$, $P_3$ are produced in synchronization with the lowest order bit signal $P_0$ which is obtained from the lowest order track $T_1$. In similar manner, the next two of bit signals $P_4$, $P_5$ are produced in synchronization with the bit signal $P_2$ obtained from the track $T_2$. Further, the bit signal $P_4$ obtained from the track $T_3$ is utilized to keep synchronization with further higher order tracks.

Referring back to FIG. 9, the description is continued to three of intermediate tracks $T_4$, $T_5$, $T_6$. These intermediate tracks $T_4$, $T_5$ and $T_6$ have also respective slit patterns formed according to the binary coded quaternary system. However, to facilitate better understanding of the drawing, the slit patterns of the intermediate tracks are illustrated by a reduction rate of 1/64 relative to the lower order tracks. These intermediate tracks have moderately fine slit patterns so that the slit patterns are directly detected without interposing an expansion optical system. Further, photodetecting areas of inverted phases are eliminated since detection signals are relatively stable because the period of the slit pattern becomes coarse.

Figure 11:
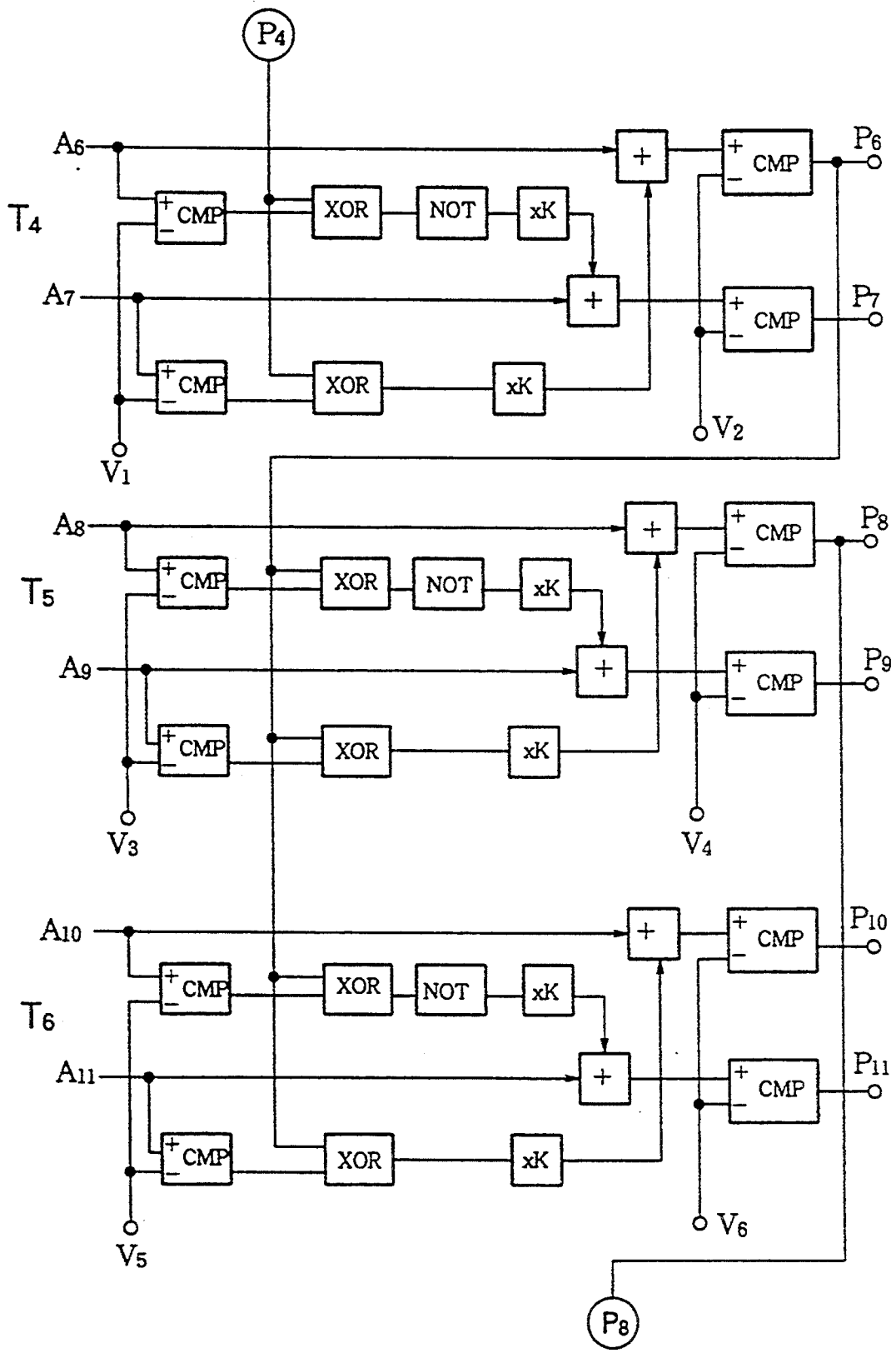

FIG. 11 is a block diagram showing a processing circuit provided correspondingly to the three intermediate order tracks $T_4$, $T_5$, $T_6$ for the synchronization operation. As described above, the photodetecting areas of the inverted phase are eliminated so that a multiple of the FIG. 4 circuit blocks are connected to each other in multiple stages. The first stage block operates to produce two of intermediate bit signals $P_6$, $P_7$ from the track $T_4$ in synchronization with the lower bit signal $P_4$ obtained from the track $T_3$. The second stage block is operated to produce next two of bit signals $P_8$, $P_9$ from the track $T_5$ in synchronization with the bit signal $P_6$ fed from the preceding first stage block. In similar manner, the third stage block produces further next two of bit signals $P_{10}$, $P_{11}$ from the track $T_6$. Accordingly, there can be obtained six number of the intermediate order bit signals in total. Further, if the span of the photodetecting area were set proportionally to the period of the slit pattern for the higher order track $T_6$, the photodetecting array would be prolonged excessively. Therefore, the span of the photodetecting areas $A_{10}$, $A_{11}$ is set identical to that of the photodetecting areas $A_8$, $A_9$ in this embodiment. Consequently, the circuit is connected such as to synchronize the bit signals $P_{10}$, $P_{11}$ obtained from the track $T_6$ to the bit signal $P_6$ obtained from the track $T_4$. Moreover, the bit signal $P_8$ obtained from the track $T_5$ is utilized to synchronize with further higher order tracks.

Figure 17:
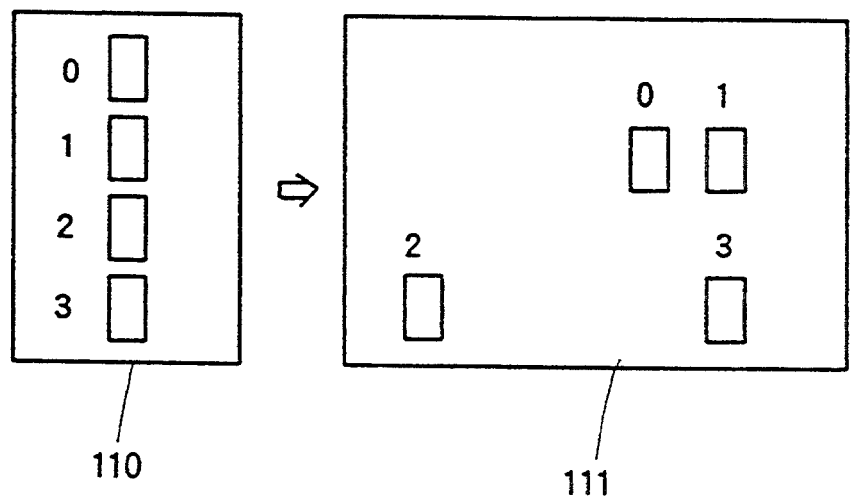
FIG. 17 is a diagram showing a layout of photodetecting areas applied to the slit patterns designed according to the binary coded quaternary system.
Figure 18:
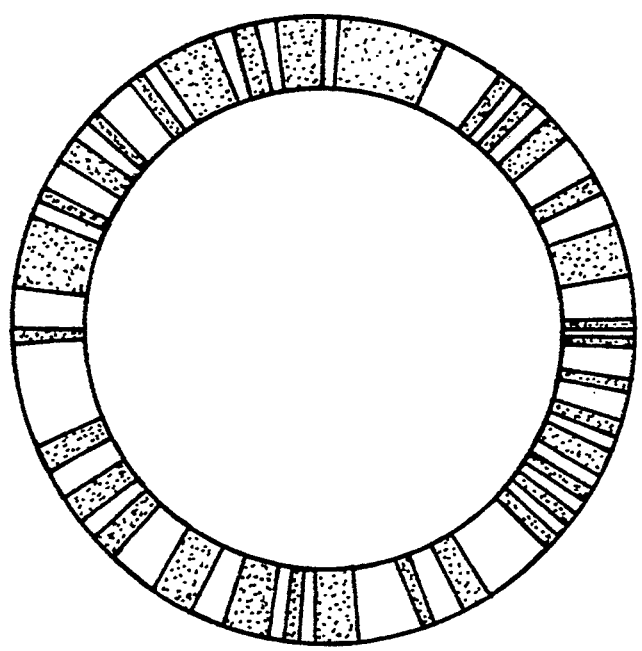
FIG. 18 is a diagram showing a conventional M-sequence slit pattern.

Again referring back to FIG. 9, the description is given to slit patterns of the last four of the higher order tracks $T_7$–$T_{10}$ and arrangements of the corresponding photodetecting areas. The last four of the higher order tracks $T_7$–$T_{10}$ are illustrated by a reduction rate of 1/16 relative to the intermediate tracks $T_4$–$T_6$ for better understanding of the drawing. In this highest part, the pair of tracks $T_7$, $T_8$ are combined to represent one binary coded quaternary number. Accordingly, a corresponding bit signal $P_{12}$ is produced from the track $T_7$, and another corresponding bit signal $P_{13}$ is produced from the track $T_8$. In similar manner, the highest order of the binary coded quaternary number is recorded on a pair of tracks $T_9$, $T_{10}$, from which corresponding bit signals $P_{14}$, $P_{15}$ are generated. Accordingly, the respective photodetecting areas $A_{12}$–$A_{15}$ are disposed along the corresponding tracks in similar manner to the construction of the photodetector array 110 shown in FIG. 17. If the pair of photodetecting areas $A_{12}$ and $A_{13}$ were disposed along one track in spaced relation from each other likewise the lower and the intermediate tracks, the angular distance therebetween would be expanded to 22.5°. Even worse, the angular distance between the photodetecting areas $A_{14}$ and $A_{15}$ would be expanded to 90°, thereby hindering detection efficiency. In view of this, one photodetecting area is assigned to one track for the higher order tracks $T_7$–$T_{10}$ so as to confine altogether the photodetecting areas in one place. Further, the span of the respective photodetecting areas $A_{12}$–$A_{15}$ is set identical to one period of the track $T_5$, and therefore the higher order bit signals are synchronized to the bit signal $P_8$.

Figure 12:
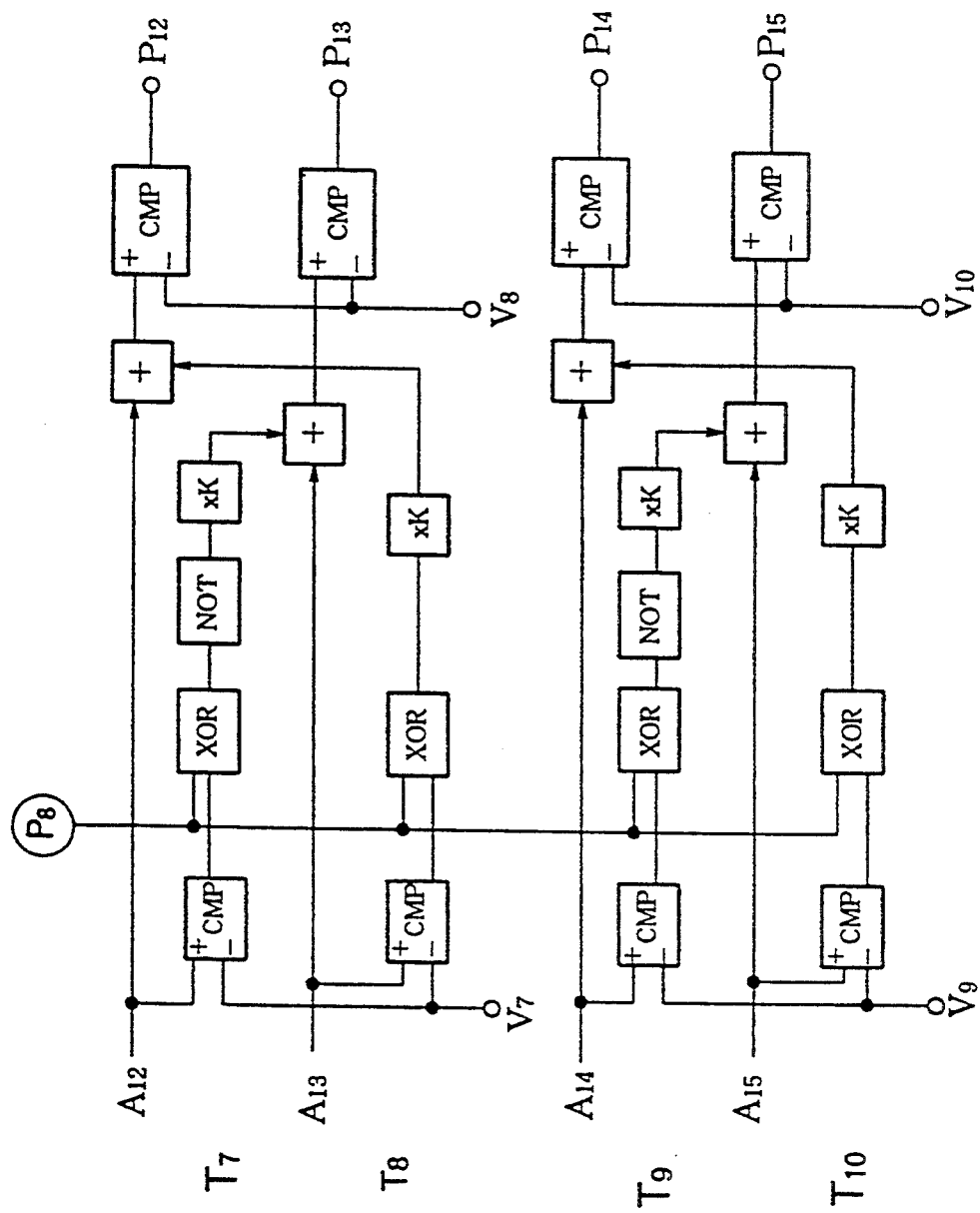
Figure 13:
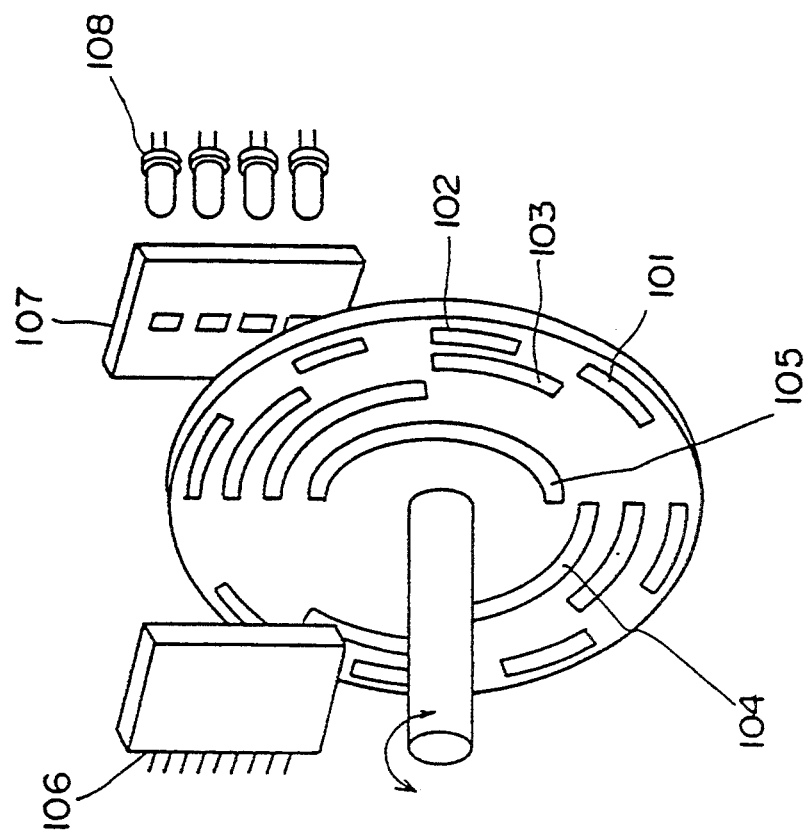
FIG. 13 is a perspective view of a conventional absolute encoder.
Figure 15:
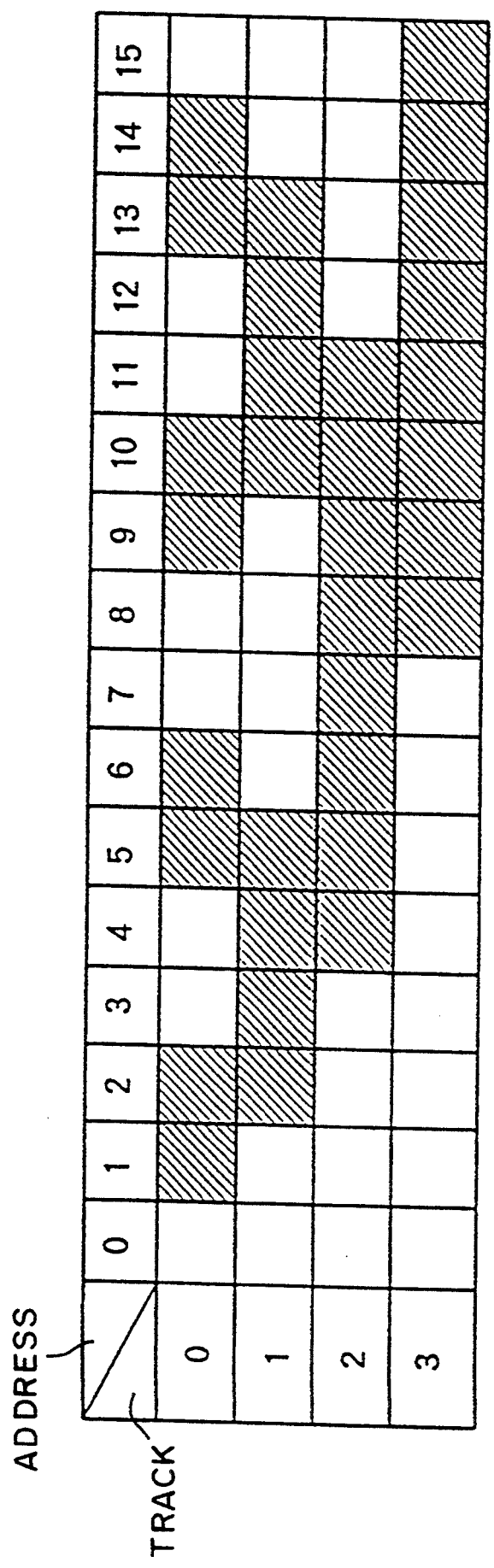
FIG. 15 is a diagram showing a slit pattern formed according to Gray coding system.
Figure 16:
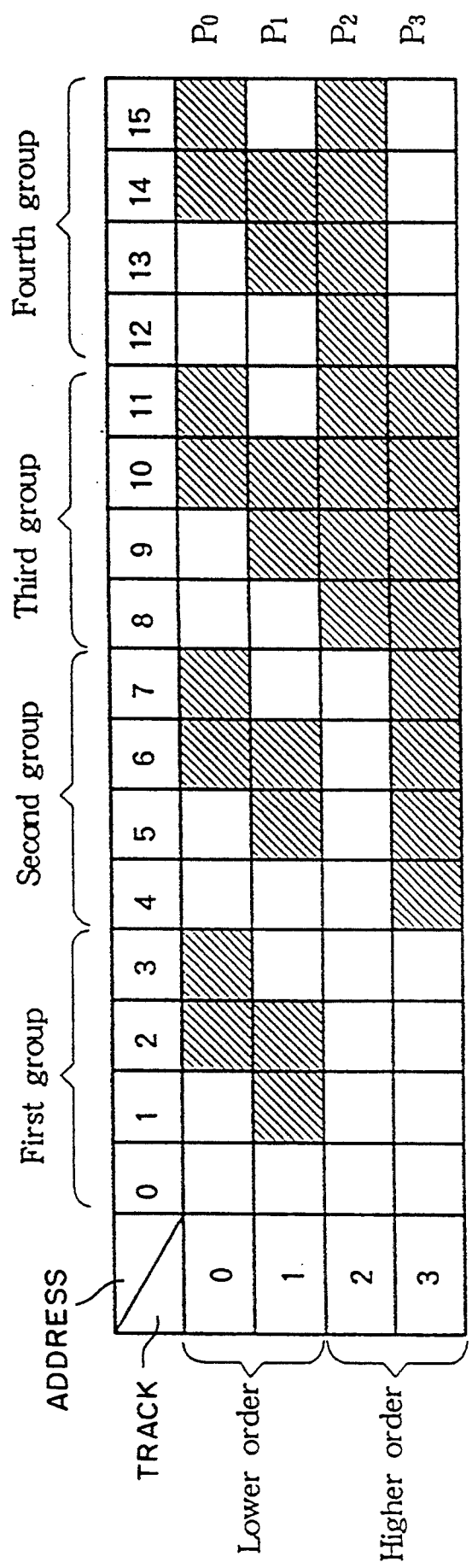
FIG. 16 is a diagram showing a slit pattern formed according to a binary coded quaternary coding system.

FIG. 12 is a block diagram showing a synchronizing process circuit provided for the four of the higher order tracks $T_7$–$T_{10}$. Basically, a pair of the FIG. 4 processing circuits are coupled to each other in corresponding to two sets of the tracks $T_7$, $T_8$ and the tracks $T_9$, $T_{10}$. As seen from the figure, the bit signals $P_{12}$, $P_{13}$, $P_{14}$ and $P_{15}$ are produced from the corresponding tracks in synchronization with the bit signal $P_8$ obtained from the intermediate track. By such a manner, all the sixteen of bit signals $P_0$–$P_{15}$ can be obtained concurrently in synchronization with either of leading and trailing edges of the lowest order bit signal $P_0$.

Industrial Applicability

As described above, according to the invention, a detection signal obtained from a lower order track is processed with another detection signal obtained from a higher order track so as to produce a higher order bit signal in synchronization with either of leading and trailing edges of a lower order bit signal. Therefore, the present invention can be suitably applied to an absolute encoder so as to remove reading error of recorded absolute addresses. Further, a slit pattern is arranged according to the binary coded quaternary system so as to reduce a number of tracks to thereby realize scale-down of the absolute encoder. Moreover, periodic slit pattern is adopted to achieve multicated collection of incident light to thereby ensure a sufficient light amount.

According to another aspect of the invention, the photodetector array is divided into two parts corresponding to lower and higher order tracks, respectively, such that an illuminating light of the lower order tracks is received through an expansion optical system, while an illuminating light of the higher order tracks is directly received. Therefore, the present invention can be suitably applied to the absolute encoder to realize micronization of the slit pattern as well as reduction of a track width. Even in case that a number of tracks is increased to achieve higher resolution power, a size of the rotary disc can be reduced efficiently. Further, synchronization is maintained between the lower and higher order tracks while the photodetecting array is divided into two parts for the lower and higher order tracks, thereby efficiently suppressing reading error of the absolute address.

We claim:

1. An absolute encoder comprising: a movable member formed thereon with a plurality of slit patterns to define a plurality of tracks bit-coded according to a given digital code system representative of absolute addresses, the tracks being arranged in parallel manner from a higher order to a lower order; a light source for irradiating an illuminating light onto the movable member; photodetecting means receptive of the illuminating light through the slit patterns to output detection signals associated with the respective tracks; and processing means for processing the detection signals to reproduce bit signals and for decoding the bit signals to read an absolute address of the movable member wherein the processing means comprises logic means for combining a lower bit signal having definite leading and trailing edges with a higher order intermediate signal having indefinite leading and trailing edges to obtain a combined signal having definite leading and trailing edges, adder means for adding the combined result with another higher order detection signal by a certain proportion, and reproduction means for reproducing a synchronized higher order bit signal based on the added results such that the higher order bit signal is synchronized with either of leading and trailing edges of the lower bit signal.

2. An absolute encoder according to claim 1, wherein the photodetecting means has photodetecting areas in registration with a lower order track for outputting lower order detection signals of opposite phases.

3. An absolute encoder according to claim 2, wherein the processing means further comprises lower order comparing means for comparing the lower order detection signals of opposite phases with each other to produce a corresponding lower order bit signal.

4. An absolute encoder according to claim 3, wherein the lower order comparing means compares the lowest order detection signals of opposite phases with each other to produce a corresponding lowest order bit signal.

5. An absolute encoder according to claim 1, wherein the logic means comprises means for processing the higher order intermediate signal with the lower order bit signal which is obtained from a lower order track immediately next to the higher order track associated to the higher order intermediate signal.

6. An absolute encoder according to claim 1, wherein the photodetecting means has a photodetecting area arranged on a higher order track and having a span corresponding to one period of a slit pattern of a lower order track.

7. An absolute encoder according to claim 6, wherein the photodetecting means has photodetecting areas in registration with a higher order track for outputting higher order detection signals of opposite phases.

8. An absolute encoder according to claim 7, wherein the logic means further comprises higher order comparing means for comparing the higher order detection signals of opposite phases with each other to produce the higher order intermediate signal.

9. An absolute encoder according to claim 1, wherein the photodetecting means has a photodetecting area in registration with a higher order track for outputting a higher order detection signal of a single phase.

10. An absolute encoder according to claim 9, wherein the logic means further comprises comparing means for comparing the higher order detection signal of the single phase with a given constant voltage signal to produce the higher order intermediate signal.

11. An absolute encoder according to claim 1, wherein the reproduction means includes comparing means for comparing a pair of the added results with each other to reproduce the higher order bit signal.

12. An absolute encoder according to claim 1, wherein the reproduction means includes comparing means for comparing the added result with a constant voltage signal to reproduce the higher order bit signal.

13. An absolute encoder according to claim 1, wherein the movable member has tracks comprised of slit patterns bit-coded according to a binary coded quaternary system, and the photodetecting means has at least a pair of photodetecting areas arranged along each track in conformity with the bit-coded slit pattern of the binary coded quaternary system, and being shifted from each other by a phase difference of 90°.

14. An absolute encoder according to claim 13, wherein the adder means comprises means for adding the logically processed result to another higher order detection signal having a phase difference of 90° relative to the first-mentioned higher order detection signal.

15. An absolute encoder according to claim 1, wherein the photodetecting means is divided into two parts corresponding to lower order tracks and higher order tracks, respectively, such that the one part receives the illuminating light from the lower order tracks through an expansion optical system and the other part receives the illuminating light directly from the higher order tracks.

16. An absolute encoder comprising: a movable member formed thereon with a plurality of slit patterns to define a plurality of tracks bit-coded according to a given digital code system representative of absolute addresses, the tracks being arranged in parallel manner from a higher order to a lower order; a light source for irradiating an illuminating light onto the movable member; photodetecting means receptive of the illuminating light through the slit patterns to output detection signals associated with the respective tracks; processing means for processing the detection signals to reproduce bit signals and for decoding the bit signals to read an absolute address of the movable member, wherein the processing means comprises logic means for combining a lower order bit signal having definite leading and trailing edges with a higher order intermediate signal having indefinite leading and trailing edges to obtain a combined signal having definite leading and trailing edges, adder means for adding the combined result and a constant voltage signal with each other by a certain proportion, and reproduction means for reproducing a synchronized higher order bit signal by comparing the added result and another higher order detection signal with each other such that the higher order bit signal is synchronized with either of leading and trailing edges of the lower order bit signal.

17. An absolute encoder according to claim 16, wherein the photodetecting means has a photodetecting area arranged on a higher order track and having a span corresponding to one period of a slit pattern of a lower order track.

18. An absolute encoder according to claim 16, wherein the logic means further comprises comparing means for comparing the higher order detection signal with another given constant voltage signal to produce the higher order intermediate signal.

19. An absolute encoder according to claim 16, wherein the movable member has tracks comprised of slit patterns bit-coded according to a binary coded quaternary system, and the photodetecting means has at least a pair of photodetecting areas arranged along each track in conformity with the bit-coded slit pattern of the binary coded quaternary system, and being shifted from each other by a phase difference of 90°.

20. An absolute encoder according to claim 19, wherein the reproduction means further comprises comparing means for comparing the added result with said another higher order detection signal having a phase difference of 90° relative to the first-mentioned higher order detection signal.

21. An absolute encoder comprising: a movable member formed thereon with a plurality of slit patterns to define a plurality of tracks bit-coded to record absolute addresses; the tracks being arranged in parallel with each other sequentially from a higher order to a lower order; a light source for irradiating an illuminating light onto the movable member; photodetecting means for receiving the illuminating light through the slit patterns to output detection signals associated to the respective tracks; and processing means for processing the detection signals to reproduce bit signals so as to read an absolute address of the movable member, wherein the photodetecting means is divided into two parts corresponding to lower order tracks and higher order tracks, respectively, such that the one part receives an expanded component of the illuminating light from the lower order tracks through an expansion optical system while the other part receives a remaining component of the illuminating light directly from the higher order tracks.

22. An absolute encoder according to claim 21, wherein the processing means includes means for synchronizing lower and higher order bit signals with each other.

* * * * *

UNITED STATES PATENT AND TRADEMARK OFFICE
CERTIFICATE OF CORRECTION

PATENT NO.   :   5,438,193
DATED        :   August 1, 1995
INVENTOR(S)  :   Masaaki Takagi; Takumi Fukuda It is certified that error appears in the above-identified patent and that said Letters Patent is hereby corrected as shown below:

On the Title Page , Item [73] Change from "Copan Company Limited" to --Copal Company Limited--.

Signed and Sealed this

Twenty-first Day of May, 1996

Attest:

BRUCE LEHMAN

Attesting Officer          Commissioner of Patents and Trademarks